(12) United States Patent
Hatori et al.

(10) Patent No.: US 10,186,607 B2
(45) Date of Patent: Jan. 22, 2019

(54) POWER SEMICONDUCTOR DEVICE INCLUDING A SEMICONDUCTOR SWITCHING ELEMENT

(71) Applicant: Mitsubishi Electric Corporation, Tokyo (JP)

(72) Inventors: Kenji Hatori, Tokyo (JP); Shuichi Kitamura, Tokyo (JP); Tetsuo Motomiya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/300,583

(22) PCT Filed: Jul. 4, 2014

(86) PCT No.: PCT/JP2014/067950
§ 371 (c)(1),
(2) Date: Sep. 29, 2016

(87) PCT Pub. No.: WO2016/002077
PCT Pub. Date: Jan. 7, 2016

(65) Prior Publication Data
US 2017/0179265 A1    Jun. 22, 2017

(51) Int. Cl.
*H01L 29/73* (2006.01)
*H01L 23/48* (2006.01)
(Continued)

(52) U.S. Cl.
CPC ...... *H01L 29/7393* (2013.01); *H01L 23/3736* (2013.01); *H01L 23/48* (2013.01);
(Continued)

(58) Field of Classification Search
CPC ............. H01L 29/7393; H01L 23/3736; H01L 29/1602; H01L 29/1608; H01L 29/2003
(Continued)

(56) References Cited

U.S. PATENT DOCUMENTS 6,597,063 B1 * 7/2003 Shimizu ................. H01L 23/24
257/687
6,873,042 B2  3/2005 Ishii et al.
(Continued)

FOREIGN PATENT DOCUMENTS

JP    2000-217337 A    8/2000
JP    2001-185679 A    7/2001
(Continued)

OTHER PUBLICATIONS

An Office Action issued by the Japanese Patent Office dated Jun. 6, 2017, which corresponds to Japanese Patent Application No. 2016-530791 and is related to U.S. Appl. No. 15/300,583; with English language partial translation.
(Continued)

*Primary Examiner* — Didarul Mazumder
(74) *Attorney, Agent, or Firm* — Studebaker & Brackett PC

(57) ABSTRACT

An object is to provide a technique that enables suppression of oscillation of a gate signal waveform. A power semiconductor device includes a power semiconductor chip, a plurality of collector main terminals and a plurality of emitter main terminals electrically connected to the power semiconductor chip, and a signal line. The plurality of collector main terminals and the plurality of emitter main terminals have protrusion portions which protrude from a disposition surface of the power semiconductor chip, respectively, and the signal line surrounds, with respect to these protrusion portions, an entire circumference of all the protrusion portions and is spaced apart therefrom in plan view.

8 Claims, 4 Drawing Sheets

(51) Int. Cl.
    H01L 25/07    (2006.01)
    H01L 23/373   (2006.01)
    H01L 29/20    (2006.01)
    H01L 29/739   (2006.01)
    H01L 25/18    (2006.01)
    H01L 29/16    (2006.01)
(52) U.S. Cl.
    CPC ............ *H01L 25/072* (2013.01); *H01L 25/18*
         (2013.01); *H01L 29/1602* (2013.01); *H01L
         29/1608* (2013.01); *H01L 29/2003* (2013.01);
                    *H01L 2224/04026* (2013.01); *H01L
         2224/04042* (2013.01); *H01L 2224/06181*
         (2013.01); *H01L 2224/291* (2013.01); *H01L
              2224/32225* (2013.01); *H01L 2224/48091*
         (2013.01); *H01L 2224/48227* (2013.01); *H01L
         2224/49113* (2013.01); *H01L 2224/49175*
         (2013.01); *H01L 2224/73265* (2013.01); *H01L
              2924/00014* (2013.01); *H01L 2924/1033*
         (2013.01); *H01L 2924/10254* (2013.01); *H01L
              2924/10272* (2013.01); *H01L 2924/1203*
                    (2013.01); *H01L 2924/13055* (2013.01)
(58) Field of Classification Search
    USPC ............................ 257/76, 737, E23.024, 532
    See application file for complete search history.

(56)            References Cited

U.S. PATENT DOCUMENTS

2003/0173579 A1*  9/2003  Ishii ...................... H01L 25/072
                                                          257/177
2012/0241953 A1*  9/2012  Yamada .............. H01L 23/4334
                                                          257/737
2013/0228909 A1*  9/2013  Nishi ...................... H01L 21/56
                                                          257/690
2013/0277800 A1* 10/2013  Hori ........................ H01L 28/40
                                                          257/532

FOREIGN PATENT DOCUMENTS

JP          2009-21345 A        1/2009
JP          2010-041809 A       2/2010
WO          02/082541 A1       10/2002

OTHER PUBLICATIONS

An Office Action; "Notification of Reason(s) for Refusal" issued by the Japanese Patent Office dated Jan. 24, 2017, which corresponds to Japanese Patent Application No. 2016-530791 and is related to U.S. Appl. No. 15/300,583; with English language partial translation.
International Search Report issued in PCT/JP2014/067950; dated Oct. 7, 2014.
Notification of Transmittal of Translation of the International Preliminary Report on Patentability and Translation of Written Opinion of the International Searching Authority; PCT/JP2014/067950 dated Jan. 19, 2017.
An Office Action mailed by the State Intellectual Property Office of the People's Republic of China dated Jul. 5, 2018, which corresponds to Chinese Patent Application No. 201480080396.3 and is related to U.S. Appl. No. 15/300,583.

* cited by examiner

F I G. 7
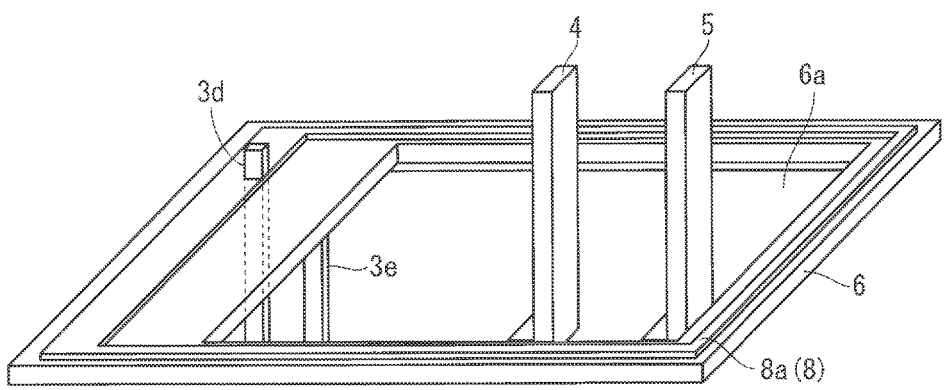
F I G. 8
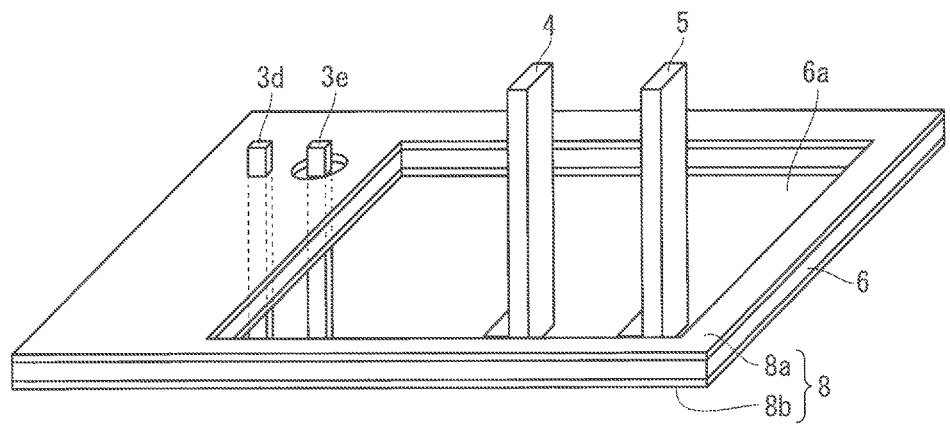

POWER SEMICONDUCTOR DEVICE INCLUDING A SEMICONDUCTOR SWITCHING ELEMENT

TECHNICAL FIELD

The present invention relates to a power semiconductor device including a semiconductor switching element.

BACKGROUND ART

A power semiconductor device including a semiconductor switching element is applied to an inverter, a converter or the like (e.g., Patent Document 1).

PRIOR ART DOCUMENT

Patent Document

Patent Document 1: Japanese Patent Application Laid-Open No. 2001-185679

SUMMARY OF INVENTION

Problem to be Solved by the Invention

In a power semiconductor device, immediately after turn-off switching, a gate signal waveform oscillates. Although a mechanism of occurrence of this oscillation phenomenon has not been thoroughly clarified, since such oscillation of a gate signal waveform might invite erroneous operation of a power semiconductor device, it is demanded to suppress the oscillation phenomenon.

Therefore, the present invention has been made in view of such problem as described above and aims at providing a technique that enables suppression of oscillation of a gate signal waveform.

Means for Solving the Problem

A power semiconductor device according to the present invention includes a semiconductor switching element, a plurality of collector main terminals and a plurality of emitter main terminals which are electrically connected to the semiconductor switching element and which have protrusion portions protruding from a disposition surface of the semiconductor switching element, respectively, and a signal line which surrounds, with respect to the protrusion portions of the plurality of collector main terminals and the protrusion portions of the plurality of emitter main terminals, an entire circumference of all the protrusion portions and which is spaced apart therefrom in plan view.

Effect of the Invention

According to the present invention, oscillation of a gate signal waveform can be suppressed.

Objects, features, modes and advantages of the present invention will become more apparent from the following detailed description and accompanying drawings.

BRIEF DESCRIPTION OF DRAWINGS

FIG. 7 is a sectional perspective view schematically showing a part of a configuration of a power semiconductor device according to a modification example of the first embodiment.

FIG. 8 is a sectional perspective view schematically showing a part of a configuration of a power semiconductor device according to a second embodiment.

MODES FOR CARRYING OUT THE INVENTION

First Embodiment

Figure 1:
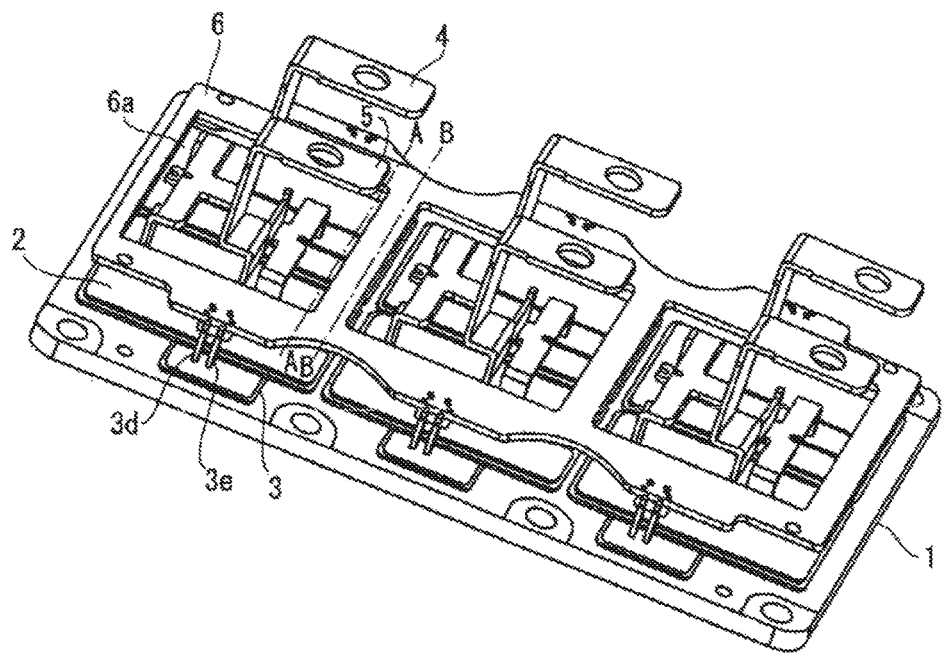
FIG. 1 is a perspective view showing a configuration of a power semiconductor device according to a first embodiment.
Figure 2:
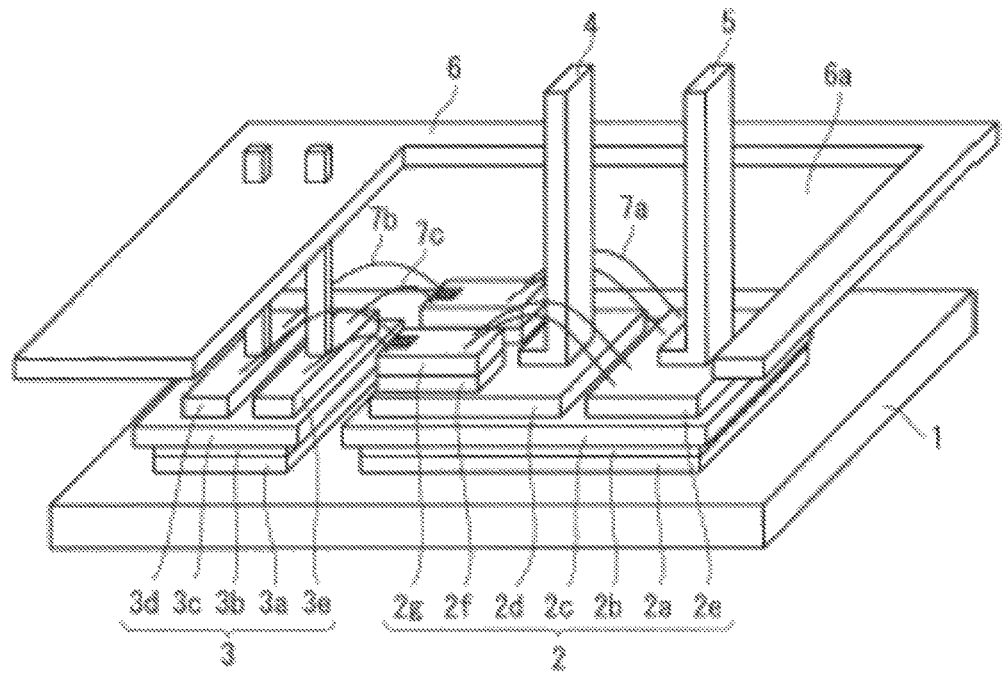
FIG. 2 is a sectional perspective view schematically showing a part of a configuration of the power semiconductor device according to the first embodiment.
Figure 3:
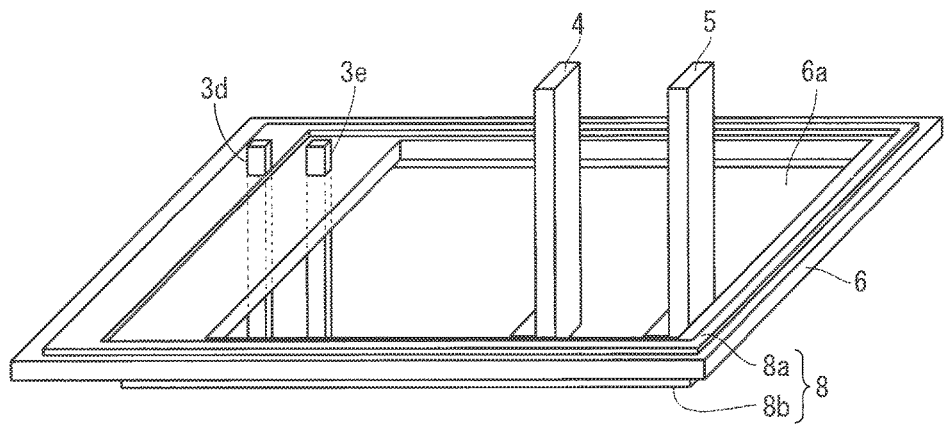
FIG. 3 is a sectional perspective view schematically showing a part of a configuration of the power semiconductor device according to the first embodiment.

FIG. 1 is a perspective view showing a configuration of a power semiconductor device according to a first embodiment of the present invention, and FIG. 2 and FIG. 3 are sectional perspective views taken along lines A-A and B-B in FIG. 1. In FIG. 2 and FIG. 3, for facilitation of understanding, illustration of a part of components of the power semiconductor device of FIG. 1 is omitted and arrangement of a gate signal electrode 3d and an emitter signal electrode 3e of FIG. 1 is changed.

The power semiconductor device according to the present first embodiment includes a base plate 1 for heat dissipation, a plurality of chip mounting substrates 2, a plurality of signal electrode portions 3, a plurality of collector main terminals 4, a plurality of emitter main terminals 5 and a printed board 6 shown in FIG. 1, an emitter wire 7a, a gate signal wire 7b and an emitter signal wire 7c shown in FIG. 2, and a signal line 8 shown in FIG. 3.

The plurality of chip mounting substrates 2 and the plurality of signal electrode portions 3 are disposed on a main surface of the base plate 1 for heat dissipation made of metal.

Each chip mounting substrate 2 includes a solder 2a, a metal electrode 2b, an insulating substrate 2c (i.e. ceramic substrate), a collector electrode 2d, an emitter electrode 2e, a solder 2f and a power semiconductor chip 2g shown in FIG. 2.

The solder 2a, the metal electrode 2b and the insulating substrate 2c are disposed in this order on the main surface of the base plate 1 for heat dissipation. The collector electrode 2d and the emitter electrode 2e are disposed on a main surface of the insulating substrate 2c. The power semiconductor chip 2g is bonded to the collector electrode 2d by the solder 2f.

In the present first embodiment, the power semiconductor chip 2g is configured by a wideband gap semiconductor of, for example, silicon carbide (SiC), gallium nitride (GaN), diamond or the like and is mounted on a not-shown semiconductor module. Then, the power semiconductor chip 2g includes a not-shown semiconductor switching element such as, for example, IGBT (Insulated Gate Bipolar Transistor) and a not-shown diode.

Each signal electrode portion 3 includes a solder 3a, a metal electrode 3b, an insulating substrate 3c (e.g. ceramic substrate), the gate signal electrode 3d and the emitter signal electrode 3e shown in FIG. 2.

The solder 3a, the metal electrode 3b and the insulating substrate 3c are disposed in this order on the main surface of the base plate 1 for heat dissipation. The gate signal electrode 3d and the emitter signal electrode 3e are disposed on a main surface of the insulating substrate 3c and have protrusion portions protruding from the disposition surface and reaching the printed board 6.

The power semiconductor chip 2g is electrically connected to the emitter electrode 2e via the emitter wire 7a, is electrically connected to the gate signal electrode 3d via the gate signal wire 7b, and is electrically connected to the emitter signal electrode 3e via the emitter signal wire 7c.

Each collector main terminal 4 is electrically connected to the power semiconductor chip 2g (semiconductor switching element) via the collector electrode 2d and has a protrusion portion protruding from a disposition surface of the power semiconductor chip 2g (semiconductor switching element). In the present first embodiment, the disposition surface of the power semiconductor chip 2g corresponds to the main surface of the insulating substrate 2c.

Each emitter main terminal 5 is electrically connected to the power semiconductor chip 2g (semiconductor switching element) via the emitter wire 7a and the emitter electrode 2e and has a protrusion portion protruding from the disposition surface of the power semiconductor chip 2g (semiconductor switching element). In the foregoing configuration, the collector main terminal 4 and the emitter main terminal 5 are connected in parallel to the power semiconductor chip 2g.

The numbers of the collector main terminals 4 and the emitter main terminals 5 may be any plural numbers, respectively, and are not limited to three, respectively, as shown in FIG. 1. A 1-in-1 (one element in one module) package in many cases assumes a structure in which two each of the collector main terminals 4 and the emitter main terminals 5, or three each of the collector main terminals 4 and the emitter main terminals 5 are connected to the semiconductor switching element to make parallel current flow to these terminals.

The printed board 6 is disposed above the disposition surface of the power semiconductor chip 2g so as to be in parallel to the disposition surface, and is provided with a plurality of holes 6a having a square shape in plan view as shown in FIG. 1 and FIG. 3. Then, in each hole 6a, protrusion portions of one pair of the collector main terminal 4 and the emitter main terminal 5 are freely fit. In such a configuration, with respect to the protrusion portions of the plurality of collector main terminals 4 and the protrusion portions of the plurality of emitter main terminals 5, the printed board 6 surrounds an entire circumference of all the protrusion portions and is spaced apart therefrom in plan view.

The signal line 8, as shown in FIG. 3, includes a gate signal line 8a and an emitter signal line 8b and is wired to the printed board 6. In FIG. 3, although the gate signal line 8a is wired on an upper surface of the printed board 6 and the emitter signal line 8b is wired on a back surface of the printed board 6, wiring is not limited thereto, and for example, both the gate signal line 8a and the emitter signal line 8b may be collectively wired on one of the upper surface and the back surface of the printed board 6.

Similarly to the printed board 6, with respect to the protrusion portions of the plurality of collector main terminals 4 and the protrusion portions of the plurality of emitter main terminals 5, the signal line 8 (the gate signal line 8a and the emitter signal line 8b) surrounds an entire circumference of all the protrusion portions and is spaced apart therefrom in plan view. A distance (gap) between the signal lines 8 (the gate signal line 8a and the emitter signal line 8b) and each of the plurality of collector main terminals 4 and the plurality of emitter main terminals 5 is determined in consideration of a withstand voltage and a size required for the power semiconductor device. For example, this distance (gap) in a power semiconductor device having a withstand voltage of 3.3 kV or more is preferably on the order of 3.0 to 30.0 mm in view of avoiding extreme increase in size of a package. This numerical value is calculated assuming that an insulation withstand voltage of an atmosphere is 3 kV/mm.

The gate signal line 8a is electrically connected to the power semiconductor chip 2g (semiconductor switching element) via the gate signal electrode 3d or the like, and the emitter signal line 8b is electrically connected to the power semiconductor chip 2g (semiconductor switching element) via the emitter signal electrode 3e or the like.

Next, prior to description of an effect of the power semiconductor device according to the present first embodiment configured as described above, a power semiconductor device related thereto (hereinafter, referred to as "related semiconductor device") will be described.

Figure 4:
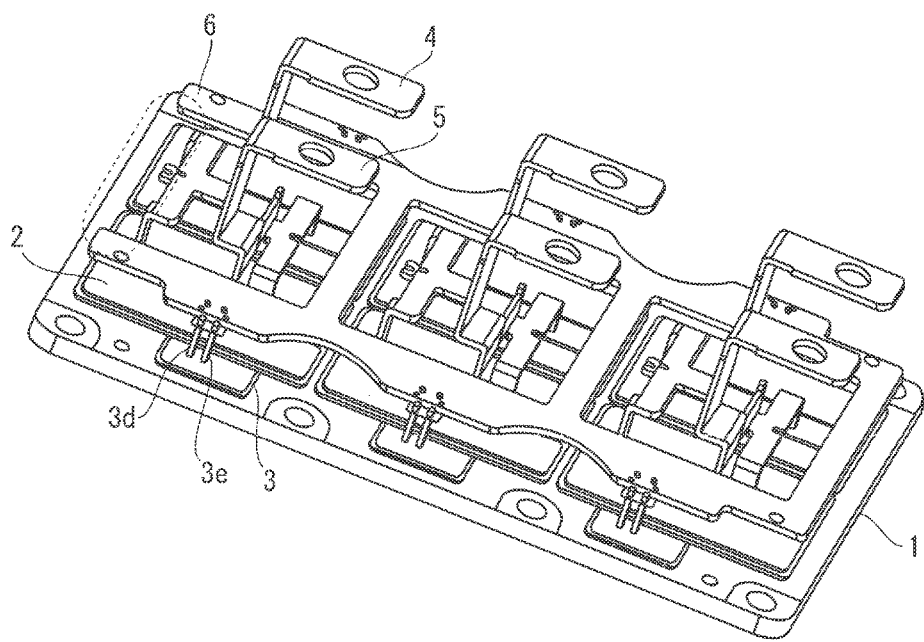
FIG. 4 is a perspective view showing a configuration of a related semiconductor device.

FIG. 4 is a perspective view showing a configuration of the related semiconductor device. As shown in FIG. 4, in the related semiconductor device, a printed board 6 is opened in a region surrounded by a dashed line. Therefore, in the related semiconductor device, with respect to protrusion portions of a plurality of collector main terminals 4 and protrusion portions of a plurality of emitter main terminals 5, a signal line 8 does not surround an entire circumference of all the protrusion portions, in which respect, the related device is different from the power semiconductor device according to the first embodiment.

Figure 5:
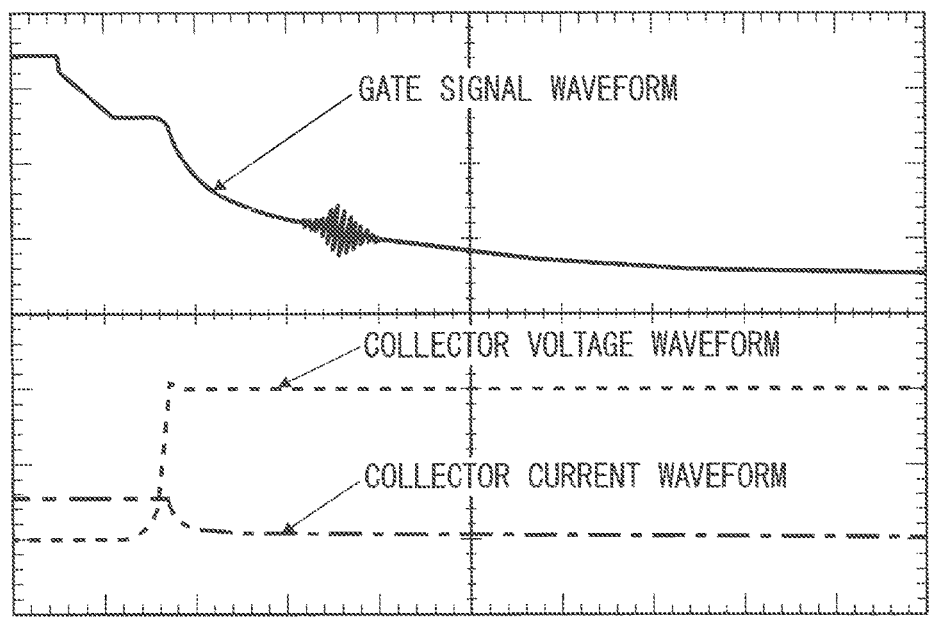
FIG. 5 is a diagram showing a waveform of each signal of the related semiconductor device.

Next, with respect to the power semiconductor device according to the present first embodiment and the related semiconductor device, waveforms of signals immediately after turn-off switching are examined. FIG. 5 is a diagram showing a waveform of each signal of the related semiconductor device and FIG. 6 is a diagram showing a waveform of each signal of the power semiconductor device according to the present first embodiment.

Effect

Figure 6:
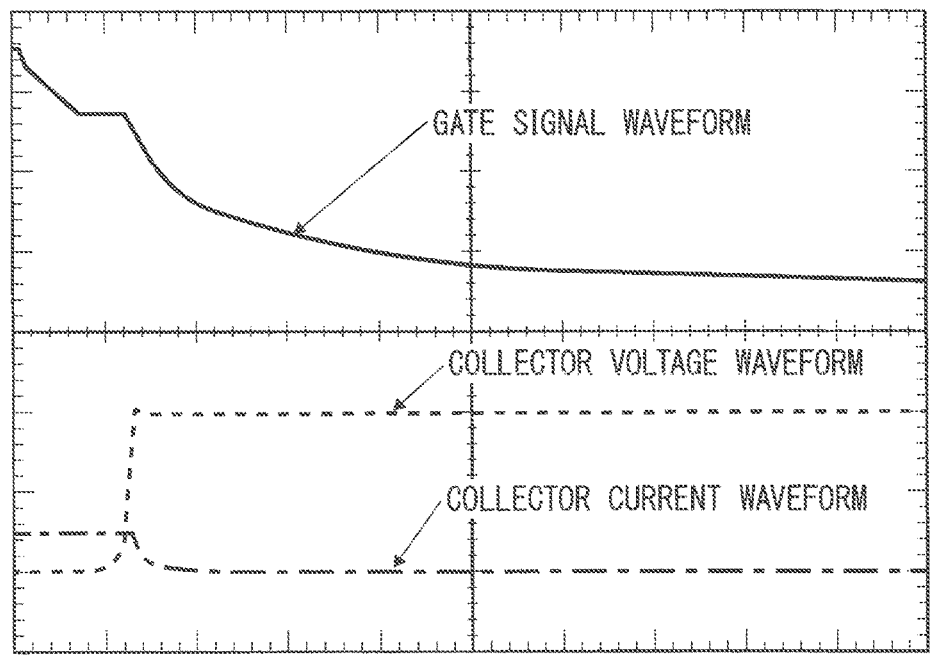
FIG. 6 is a diagram showing a waveform of each signal of the power semiconductor device according to the first embodiment.

As can be seen from the results shown in FIG. 5 and FIG. 6, in the related semiconductor device, a waveform of a gate signal oscillates, while in the power semiconductor device according to the present first embodiment, oscillation of a waveform of a gate signal can be suppressed. Accordingly, according to the present first embodiment, a highly reliable power semiconductor device can be realized.

In particular, because such an oscillation phenomenon is liable to occur in a device configured by a wideband gap semiconductor such as SiC or the like, the above effect is valid.

Additionally, in the present first embodiment, since the signal line 8 (the gate signal line 8a and the emitter signal line 8b) is wired on the printed board 6, the signal line 8 can be formed (wired) with ease.

Modification Example

In the first embodiment, the signal line 8 surrounding an entire circumference of the protrusion portions of the collector main terminals 4 and the emitter main terminal 5 includes both the gate signal line 8a and the emitter signal line 8b. The signal line 8 is not limited thereto and may include one of the gate signal line 8a and the emitter signal line 8b. FIG. 7 shows a configuration in which the signal line 8 includes the gate signal line 8a without including the emitter signal line 8b.

Also with such a configuration of the present modification example, the effect of the first embodiment can be obtained to some extent. However, in view of increasing an effect of suppressing oscillation of a gate signal waveform, as in the first embodiment, the signal line 8 preferably includes both the gate signal line 8a and the emitter signal line 8b.

Second Embodiment

FIG. 8 is a sectional perspective view schematically showing a part of a configuration of a power semiconductor device according to a second embodiment of the present invention. In the power semiconductor device according to the present second embodiment, the same or like components as those described above are denoted by the same reference numerals and description will be mainly made of different parts.

As shown in FIG. 8, in the present second embodiment, an emitter signal line 8b as a ground potential is formed on a printed board 6 by a solid pattern (substantially covering a whole of one of main surfaces of the printed board 6). This enables suppression of an influence of electromagnetic induction exerted by a main current flowing through a collector main terminal 4 and an emitter main terminal 5 on the signal line 8 by means of a shielding effect of the emitter signal line 8b. As a result, the effect of suppressing oscillation of a gate signal waveform can be increased. Additionally, since a gate signal line 8a is also formed by a solid pattern in the present second embodiment, the effect of suppressing oscillation of a gate signal waveform can be similarly increased.

Further, in the present second embodiment, the gate signal line 8a and the emitter signal line 8b are formed of flat plates parallel to each other, and sandwich the printed board 6 to form a parallel flat plate structure (multilayer wiring structure). This enables reduction of an inductance of the signal line 8, so that the influence of electromagnetic induction exerted by a main current flowing through the collector main terminal 4 and the emitter main terminal 5 on the signal line 8 can be suppressed. As a result, the effect of suppressing oscillation of a gate signal waveform can be further increased.

Modification Examples

In the second embodiment, both the gate signal line 8a and the emitter signal line 8b are formed by a solid pattern. However, the configuration is not limited thereto and one of the gate signal line 8a and the emitter signal line 8b may be formed by a solid pattern and the other may not be formed by a solid pattern.

Also with such a configuration of the present modification example, the effect of the second embodiment can be obtained to some extent. However, in view of increasing the effect of suppressing oscillation of a gate signal waveform, as in the second embodiment, both the gate signal line 8a and the emitter signal line 8b are preferably formed by the solid pattern.

Additionally, it is assumed that a comparatively high voltage is applied to a collector main terminal 4 than to other component. In view of this, the collector main terminal 4 may be coated with a resin having insulating properties. With such a configuration, since a distance (gap) between the signal line 8 and the collector main terminal 4 can be reduced (e.g. to less than 3.0 mm) while maintaining a withstand voltage of the power semiconductor device, size reduction of the device can be realized.

In the present invention, the respective embodiments and modification examples can be freely combined or the respective embodiments and modification examples can be appropriately modified or omitted within the scope of the invention.

Although the present invention has been described in detail, the above description is for illustrative purpose only in all aspects and the present invention is not limited thereto. It is understood that various modification examples not illustrated can be made without departing from the scope of the present invention.

REFERENCE SIGNS LIST

2g: power semiconductor chip
4: collector main terminal
5: emitter main terminal
6: printed board
8: signal line
8a: gate signal line
8b: emitter signal line

The invention claimed is:

1. A power semiconductor device comprising:
    a semiconductor switching element;
    a plurality of collector main terminals and a plurality of emitter main terminals electrically connected to said semiconductor switching element and having protrusion portions which protrude from a disposition surface of said semiconductor switching element; respectively; and
    a signal line spaced apart from and entirely surrounding said protrusion portions of said plurality of collector main terminals and said protrusion portions of said plurality of emitter main terminals above the semiconductor switching element in a plan view.

2. The power semiconductor device according to claim 1, wherein
    said signal line includes at least one of a gate signal line and an emitter signal line electrically connected to said semiconductor switching element.

3. The power semiconductor device according to claim 2, wherein
    said signal line includes said gate signal line and said emitter signal line, and
    said gate signal line and said emitter signal line are formed of flat plates parallel to each other.

4. The power semiconductor device according to claim 1, further comprising a printed board disposed above said disposition surface,
    wherein said signal line is wired on said printed board.

5. The power semiconductor device according to claim 1, wherein said plurality of collector main terminals are coated with a resin having insulating properties.

6. The power semiconductor device according to claim 2, further comprising a printed board disposed above said disposition surface,
    wherein at least one of said gate signal line and emitter signal line is formed on said printed board by a solid pattern.

7. The power semiconductor device according to claim 1, wherein said semiconductor switching element is included in a semiconductor chip mounted on a semiconductor module and configured by a wideband gap semiconductor.

8. The power semiconductor device according to claim 1, wherein said signal line includes both a gate signal line and an emitter signal line electrically connected to said semiconductor switching element.

* * * * *